United States Patent
Mori et al.

(10) Patent No.: US 8,076,681 B2
(45) Date of Patent: Dec. 13, 2011

(54) WHITE ORGANIC ELECTROLUMINESCENT DEVICE

(75) Inventors: Toshifumi Mori, Tokyo (JP); Koichi Suzuki, Yokohama (JP); Akira Tsuboyama, Machida (JP); Satoru Shiobara, Kawasaki (JP); Kenichi Ikari, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 270 days.

(21) Appl. No.: 12/573,367

(22) Filed: Oct. 5, 2009

(65) Prior Publication Data

US 2010/0090238 A1 Apr. 15, 2010

(30) Foreign Application Priority Data

Oct. 10, 2008 (JP) .................. 2008-264426
Sep. 28, 2009 (JP) .................. 2009-222632

(51) Int. Cl.
*H01L 29/20* (2006.01)
*H01L 33/00* (2006.01)
*H01L 29/201* (2006.01)
*H01L 29/24* (2006.01)
*H01L 29/08* (2006.01)
*H01L 35/24* (2006.01)
*H01L 51/00* (2006.01)
*H01L 23/58* (2006.01)
*H01L 23/48* (2006.01)
*H01L 23/52* (2006.01)
*H01L 29/40* (2006.01)

(52) U.S. Cl. ............ 257/89; 257/40; 257/90; 257/103; 257/642; 257/643; 257/759; 257/E27.117; 257/E31.121; 257/E31.122; 257/E31.123; 257/E39.007; 257/E51.004; 257/E51.005; 257/E51.006; 257/E51.018; 257/E51.022

(58) Field of Classification Search ............... 257/40, 257/89, 90, 103, 642, 643, 759, E27.117, 257/E31.121, E31.122, E31.123, E39.007, 257/E51.004, E51.005, E51.006, E51.018, 257/E51.022
See application file for complete search history.

(56) References Cited

U.S. PATENT DOCUMENTS

| | | | | |
|---|---|---|---|---|
| 7,285,907 B2 * | 10/2007 | D'Andrade et al. | .......... | 313/504 |
| 7,427,445 B2 * | 9/2008 | Bae et al. | .......... | 428/690 |
| 7,491,450 B2 | 2/2009 | Okinaka et al. | .......... | 428/690 |
| 7,545,093 B2 * | 6/2009 | Lin et al. | .......... | 313/504 |
| 7,604,873 B2 | 10/2009 | Okinaka et al. | .......... | 428/690 |
| 7,768,194 B2 * | 8/2010 | Forrest et al. | .......... | 313/504 |

(Continued)

FOREIGN PATENT DOCUMENTS

CN 101159319 A 4/2008

(Continued)

OTHER PUBLICATIONS

Akira Tsuboyama et al., "Photophysical Properties of Highly Luminescent Copper(I) Halide Complexes Chelated with 1,2-Bis(diphenylphosphino)benzene," Inorganic Chemistry, vol. 46, No. 6, pp. 1992-2001 (2007).

(Continued)

*Primary Examiner* — Ida M Soward
(74) *Attorney, Agent, or Firm* — Fitzpatrick, Cella, Harper & Scinto

(57) ABSTRACT

A high-efficiency, white organic electroluminescent device has such a structure that its emission layer is obtained by laminating sub-emission layers of red, green, and blue, respectively. The green sub-emission layer contacting a hole transport layer has a delayed fluorescent material, and the red sub-emission layer has a phosphorescent light emitting material.

4 Claims, 3 Drawing Sheets

U.S. PATENT DOCUMENTS

| | | | |
|---|---|---|---|
| 7,794,856 B2 * | 9/2010 | Shiobara et al. | 428/690 |
| 7,794,858 B2 * | 9/2010 | Park et al. | 428/690 |
| 7,807,277 B2 * | 10/2010 | Negishi | 428/690 |
| 7,911,134 B2 * | 3/2011 | Prakash et al. | 313/506 |
| 7,927,719 B2 * | 4/2011 | Hwang et al. | 428/690 |
| 7,986,090 B2 * | 7/2011 | Pfeiffer et al. | 313/504 |
| 2006/0232194 A1 * | 10/2006 | Tung et al. | 313/504 |
| 2007/0020484 A1 * | 1/2007 | Kim et al. | 428/690 |
| 2007/0035238 A1 * | 2/2007 | Nakagawa et al. | 313/504 |
| 2007/0126350 A1 * | 6/2007 | Lee et al. | 313/506 |
| 2007/0152573 A1 * | 7/2007 | Kim et al. | 313/506 |
| 2008/0020669 A1 * | 1/2008 | Feehery et al. | 445/58 |
| 2008/0036370 A1 * | 2/2008 | Noh et al. | 313/504 |
| 2008/0102310 A1 * | 5/2008 | Thompson et al. | 428/690 |
| 2008/0286610 A1 * | 11/2008 | Deaton et al. | 428/704 |
| 2009/0091255 A1 * | 4/2009 | Lee et al. | 313/504 |
| 2009/0218934 A1 * | 9/2009 | Song et al. | 313/504 |
| 2010/0044689 A1 * | 2/2010 | Nishimura et al. | 257/40 |
| 2010/0096978 A1 * | 4/2010 | Wilson | 313/504 |
| 2010/0314648 A1 * | 12/2010 | Fehrer et al. | 257/98 |

FOREIGN PATENT DOCUMENTS

| | | |
|---|---|---|
| EP | 1 414 081 A2 | 4/2004 |
| JP | 06-207170 | 7/1994 |
| JP | 2004-241374 | 8/2004 |
| WO | WO 2006/130883 A2 | 12/2006 |

OTHER PUBLICATIONS

Akira Tsuboyama et al., "Homoleptic Cyclometalated Iridium Complexes with Highly Efficient Red Phosphorescence and Application to Organic Light-Emitting Diode," J. Am. Chem. Soc., vol. 125, pp. 12971-12979 (2003).

European Search Report issued in the counterpart application No. 09172514.3 dated Mar. 14, 2011—8 pages.

Chinese Office Action issued in the counterpart application No. 200910178477.8 dated Feb. 28, 2011 along with its English-language translation—11 pages.

* cited by examiner

PHOSPHORESCENCE

DELAYED FLUORESCENCE

R, G, OR B

WHITE ORGANIC ELECTROLUMINESCENT DEVICE

BACKGROUND OF THE INVENTION

1. Field of the Invention

The present invention relates to a white organic electroluminescent (EL) device having a green sub-emission layer, a red sub-emission layer, and a blue sub-emission layer, the layers being laminated.

2. Description of the Related Art

White organic EL devices having the following characteristics have been developed: the devices each have a green sub-emission layer, a red sub-emission layer, and a blue sub-emission layer, the layers being laminated, and lights emitted from the respective layers undergo color mixture so that white light may be emitted.

Japanese Patent Application Laid-Open No. H06-207170 describes a white organic EL device in which light emission from each of sub-emission layers is caused by a fluorescent light emitting material in the sub-emission layer.

In addition, Japanese Patent Application Laid-Open No. 2004-241374 describes an organic EL device having a delayed fluorescent material.

A reduction in driving voltage of a white organic EL device having the following characteristics has been required: the device has a green sub-emission layer, a red sub-emission layer, and a blue sub-emission layer, the layers being laminated, and lights emitted from the respective layers undergo color mixture so that white light may be emitted.

Japanese Patent Application Laid-Open No. 2004-241374 describes the organic EL device having the delayed fluorescent material, but does not describe a white organic EL device having the following characteristics: the device has a green sub-emission layer, a red sub-emission layer, and a blue sub-emission layer, the layers being laminated, and lights emitted from the respective layers undergo color mixture so that white light may be emitted. In addition, the delayed fluorescent material in Japanese Patent Application Laid-Open No. 2004-241374 shows each of a strong delayed fluorescent spectrum and a strong phosphorescent spectrum in the range of 520 nm to 750 nm, and an emission wavelength actually illustrated in the figure is formed of a peak having a maximum emission wavelength in excess of 550 nm and a peak having a maximum emission wavelength in excess of 600 nm. That is, the delayed fluorescent material is not a light emitting material that emits light of a primary color such as a green or blue color in view of its color purity.

SUMMARY OF THE INVENTION

The present invention provides a white organic EL device having the following characteristics: the device has a green sub-emission layer, a red sub-emission layer, and a blue sub-emission layer, the layers being laminated, lights emitted from the respective layers undergo color mixture so that white light may be emitted, and the device has a low driving voltage.

The present invention provides a white organic EL device for emitting white light, including: a substrate; an anode; a hole transport layer; an emission layer a red sub-emission layer, a green sub-emission layer, and a blue sub-emission layer; and a cathode, the anode, the hole transport layer, the emission layer and the cathode being placed on the substrate in which: the green sub-emission layer is placed to be in contact with the hole transport layer, the red sub-emission layer is placed to be in contact with the green sub-emission layer; the blue sub-emission layer is placed to be in contact with the red sub-emission layer; the green sub-emission layer has a delayed fluorescent material, the red sub-emission layer has a phosphorescent light emitting material; a highest occupied molecular orbital (HOMO) of the delayed fluorescent material is deeper than an HOMO of a material of the hole transport layer; and the HOMO of the delayed fluorescent material is shallower than an HOMO of the phosphorescent light emitting material.

The green sub-emission layer having the delayed fluorescent material showing high efficiency is placed so as to be adjacent to the hole transport layer, so there is no need to widen a barrier between the HOMO's of the hole transport layer and the green sub-emission layer. In addition, the red sub-emission layer can emit light with high efficiency because the layer has the phosphorescent light emitting material.

Further features of the present invention will become apparent from the following description of exemplary embodiments with reference to the attached drawings.

DESCRIPTION OF THE EMBODIMENTS

Figure 1:
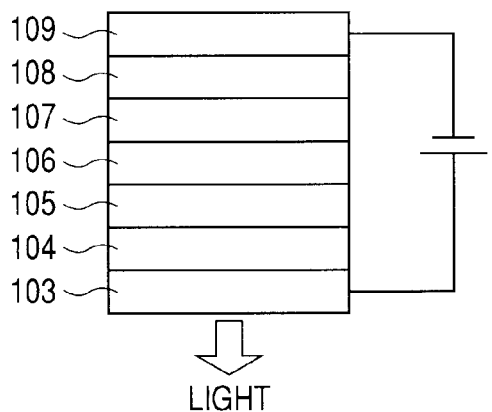
FIG. 1 illustrates a constitution of a section of a white organic EL device corresponding to Example 1.

A white organic EL device for emitting white light according to the present invention includes: a substrate; an anode; a hole transport layer; an emission layer having a red sub-emission layer, a green sub-emission layer, and a blue sub-emission layer; and a cathode, the anode, the hole transport layer, the emission layer and the cathode being placed on the substrate in which: the green sub-emission layer is placed to be in contact with the hole transport layer; the red sub-emission layer is placed to be in contact with the green sub-emission layer, the blue sub-emission layer is placed to be in contact with the red sub-emission layer, the green sub-emission layer has a delayed fluorescent material; the red sub-emission layer has a phosphorescent light emitting material; an HOMO of the delayed fluorescent material is deeper than an HOMO of a material of the hole transport layer; and the HOMO of the delayed fluorescent material is shallower than an HOMO of the phosphorescent light emitting material.

Therefore, the green sub-emission layer having the delayed fluorescent material showing high efficiency is placed so as to be adjacent to the hole transport layer, so there is no need to widen a barrier between the HOMO's of the hole transport layer and the green sub-emission layer. In addition, the red sub-emission layer can emit light with high efficiency because the layer has the phosphorescent light emitting material.

As described later, not only such relationship among the HOMO's of the delayed fluorescent material, the material of the hole transport layer, and the phosphorescent light emitting material as described above but also the following relationship is preferably satisfied: the HOMO of a host material for the green sub-emission layer is deeper than the HOMO of the material of the hole transport layer, and the HOMO of the host material for the green sub-emission layer is shallower than the HOMO of a host material for the red sub-emission layer.

In this case, the HOMO and lowest unoccupied molecular orbital (LUMO) of the delayed fluorescent material are positioned between the HOMO and LUMO of the host material for the green sub-emission layer in terms of an energy diagram. In addition, the HOMO and LUMO of the phosphorescent light emitting material are also positioned between the HOMO and LUMO of the host material for the red sub-emission layer.

It is preferred that: the blue sub-emission layer be placed on a light extraction side; and the green sub-emission layer be placed so as to be more distant from the side than the blue sub-emission layer is. In this case, the blue sub-emission layer is placed on a side closer to the cathode than any other sub-emission layer is. Defining the cathode as an electrode on the light extraction side, that is, an electrode through which light transmits obviates the need for placing the blue sub-emission layer so that the layer may be most distant from the electrode on the light extraction side. The reason why such placement should be avoided is as follows: blue light has high energy, so the light must be prevented from passing through the green and red sub-emission layers to be emitted from the organic EL device to the outside to the extent possible.

While a fluorescent light emitting material cannot theoretically achieve an internal quantum efficiency of 100%, a phosphorescent light emitting material can theoretically achieve an internal quantum efficiency of 100%. While the fluorescent light emitting material emits light from its excited singlet state S1, the phosphorescent light emitting material emits light from its excited triplet state T1.

When two certain materials emit lights of the same color, the material requiring a lower energy for its light emission out of the two forestalls an increase in driving voltage. In this case, the energy depends on the S1 of a material. That is, when which one of the two materials requires higher energy for its light emission is determined, the S1's of the respective materials are compared, and the material having the higher S1 is regarded as requiring higher energy.

When a fluorescent light emitting material and a phosphorescent light emitting material which emit lights of the same color are compared, the phosphorescent light emitting material requires higher energy for its light emission than the fluorescent light emitting material does. This is because of the following reason. The S1 of the fluorescent light emitting material and the T1 of the phosphorescent light emitting material are identical in energy when the materials emit lights of the same color. Since the S1 of a material is higher than the T1 of the material, the S1 of the phosphorescent light emitting material is higher than the S1 of the fluorescent light emitting material.

Therefore, the phosphorescent light emitting material increases the driving voltage.

In view of the foregoing, the fluorescent light emitting material has a low driving voltage and has low internal quantum efficiency. In contrast, the phosphorescent light emitting material has a high driving voltage and has high internal quantum efficiency.

In addition, the height of the S1 of a material is related to the width of the band gap of the material. That is, the higher the S1, the wider the band gap.

Attention is paid to the HOMO of a material having a wide band gap. What should be noted upon supply of a carrier from an electrode to an emission layer in an organic EL device is a barrier between layers.

The term "organic EL device" as used herein refers to a device having at least an emission layer and another layer between an anode and a cathode.

When a barrier between the emission layer and the other layer adjacent to the emission layer is large, no carrier is supplied to the emission layer.

When the emission layer is obtained by laminating a green sub-emission layer, a red sub-emission layer, and a blue sub-emission layer, attention should be paid also to a barrier between sub-emission layers from the viewpoint of the injection of a carrier.

When the band gap of a material is wide, the HOMO of the material is deep (distant) from a vacuum level, and the LUMO of the material is close to (shallow from) the vacuum level as compared to a material generally used in a layer where the above material should be used.

Although a large number of kinds of materials can be used in a certain layer of the layers of an organic EL device, the HOMO's or LUMO's of the materials show values substantially close to each other.

For example, the HOMO's of materials that can be used in a hole transport layer show values substantially close to each other irrespective of the kinds of the materials.

In such case, a barrier between the HOMO's of an emission layer adjacent to the hole transport layer and the hole transport layer must be prevented from becoming high.

In view of the foregoing, the following contrivance has been made in the present invention: a sub-emission layer adjacent to the hole transport layer is the green sub-emission layer having the delayed fluorescent material.

This is because of the following reasons: the delayed fluorescent material has higher internal quantum efficiency than that of a fluorescent material; and the delayed fluorescent material has a lower S1 than that of a phosphorescent light emitting material that emits green light.

A phosphorescent light emitting material having high internal quantum efficiency is used in the red sub-emission layer. In addition, the blue sub-emission layer is positioned so as to be closest to the light extraction side out of the sub-emission layers.

Figure 4:
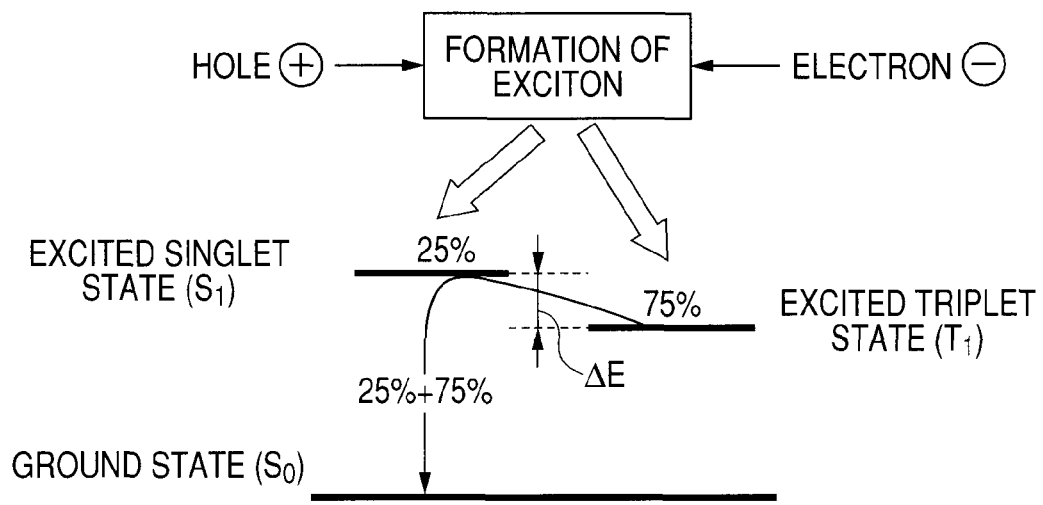
FIG. 4 illustrates an emission mechanism for delayed fluorescence.

FIG. 4 illustrates an emission mechanism for the delayed fluorescent material in the emission layer of the organic EL device. Excitons formed by recombination between holes and electrons in the emission layer are distributed as follows in accordance with their spin multiplicities: 25% of the excitons are distributed to an excited singlet state ($S_1$), and 75% of the excitons are distributed to an excited triplet state ($T_1$). In delayed fluorescence, the $T_1$ is thermally excited to the $S_1$, and light emission occurs by virtue of an electron transition from the $S_1$ to an $S_0$. As a result, all excitons in the $S_1$ and $T_1$ formed in the emission layer can each be extracted as light. Therefore, as in the case of phosphorescence, an upper limit for the internal quantum efficiency of the delayed fluorescent material can be set to 100% in principle.

As described here, the delayed fluorescence of the present invention utilizes the thermal excitation from the $T_1$ to the $S_1$. Therefore, the delayed fluorescence in the present invention is thermal excitation-type delayed fluorescence.

Figure 5A:
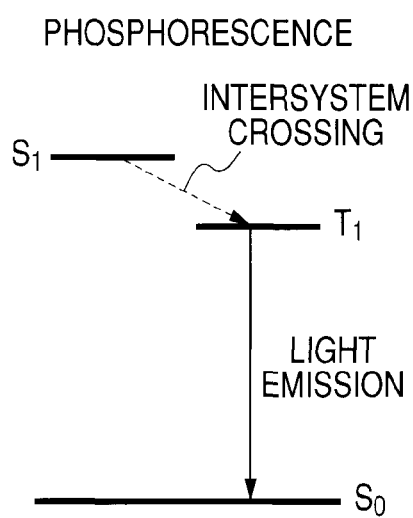
FIGS. 5A and 5B are views for comparison between the emission mechanism for the delayed fluorescence and that for phosphorescence.
Figure 5B:
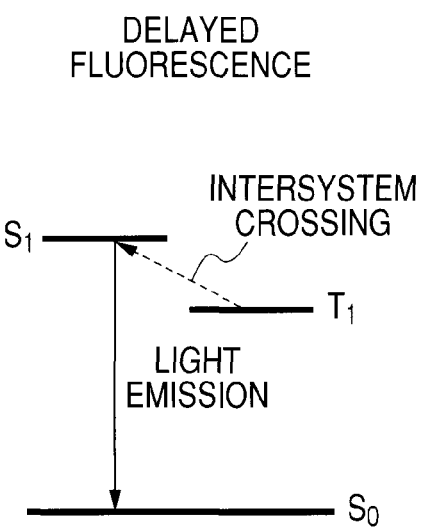

FIGS. 5A and 5B schematically illustrate energy levels when the delayed fluorescence and phosphorescence have the same emission wavelength, and the energy levels are compared. When attention is paid to the energy difference between the $S_1$ and the $S_0$, and energy difference between the $T_1$ and the $S_0$, of each of the delayed fluorescence and phosphorescence, the energy differences of the delayed fluorescence are smaller than those of phosphorescence. In other words, the following fact can be understood: as long as the delayed fluorescence and phosphorescence have the same emission wavelength, a band gap in the delayed fluorescence is smaller than that in phosphorescence.

The case where a light emitting material having a small band gap is used in an organic EL device is considered. In the organic EL device, one or more organic layers are provided between an anode and a cathode. When a hole is injected from the anode and an electron is injected from the cathode, a barrier for injection from an electrode to an organic layer (energy barrier) is of concern, and the driving voltage strongly depends on the barrier for injection. In addition, when the device is formed of multiple organic layers, a barrier for injection between organic layers is similarly of concern. The use of the light emitting material having a small band gap can reduce the sizes of the above barriers for injection. As a result, the ease with which a hole is injected from the anode to an organic layer is improved, and the ease with which an electron is injected from the cathode to an organic layer is also improved. Therefore, the driving voltage can be reduced, and the power efficiency (lm/W) of the device can be improved in accordance with the increase.

Examples of the delayed fluorescent material include a copper complex, a platinum complex, and a palladium complex. Examples of the delayed fluorescent material are shown below.

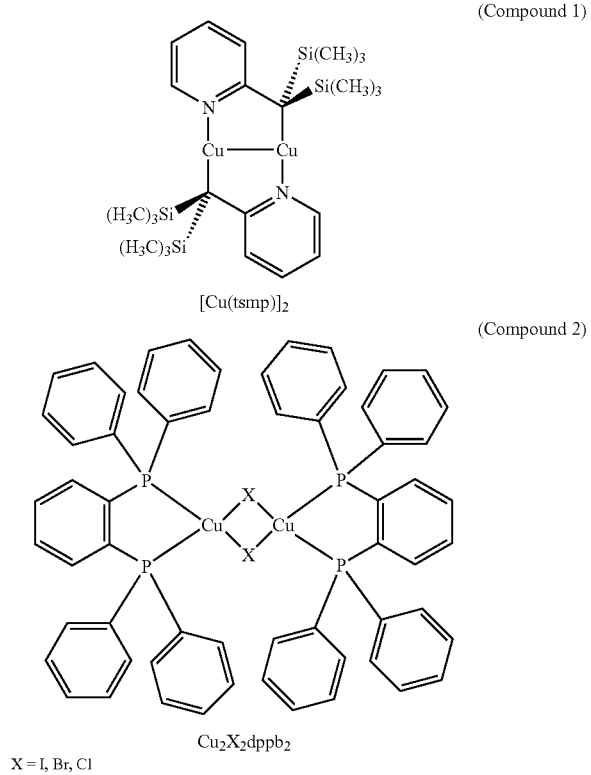

(Compound 1)

[Cu(tsmp)]$_2$ (Compound 2)

Cu$_2$X$_2$dppb$_2$

X = I, Br, Cl

The emission process of the delayed fluorescent material to be used in the present invention can be identified as the delayed fluorescence on the basis of the emission characteristics of the material. The emission of light from a compound capable of delayed fluorescence to be used in the present invention has the following characteristics:

(1) an emission lifetime at room temperature (298 K) is at a level of $10^{-6}$ sec;
(2) an emission wavelength at room temperature (298 K) is shorter than an emission wavelength at a low temperature (77 K);
(3) the emission lifetime at room temperature (298 K) is much shorter than an emission lifetime at the low temperature (77 K); and
(4) an emission intensity increases with increasing temperature.

In the case of ordinary fluorescence and phosphorescence, comparison between an emission wavelength at room temperature and an emission wavelength at the low temperature shows that the wavelengths are identical to each other, or the emission wavelength at the low temperature is shorter than the other. In contrast, in the case of the delayed fluorescence, an emission wavelength at the low temperature is longer than an emission wavelength at room temperature. This is because of the following reason: although light emission from a singlet is observed at room temperature, light emission occurs at low temperatures from the triplet which is a state lower in energy level than the singlet. The term "emission wavelength" as used herein refers to the maximum emission wavelength or the wavelength at which light emission starts.

In addition, in the case of ordinary fluorescence, an emission lifetime is of the order of $10^{-9}$ sec because light emission occurs from the singlet. In contrast, in the case of phosphorescence in which the triplet is involved in light emission, an emission lifetime is of the order of $10^{-6}$ sec. Similarly, in the case of the delayed fluorescence, an emission lifetime is of the order of $10^{-6}$ sec because the triplet is involved in light emission. The light emitting material used in the present invention preferably has an emission lifetime of 0.1 microsecond or more to less than 1 millisecond in a solid state or solution state.

With regard to an emission lifetime, the emission lifetime of each of the delayed fluorescence and phosphorescence is at a level of $10^{-6}$ sec; in the case of the delayed fluorescence, however, an emission lifetime at the low temperature is much longer than an emission lifetime at room temperature. For example, when it is assumed that non-radiation deactivation is suppressed at the low temperature, in the case of a phosphorescent light emitting compound having a quantum efficiency at room temperature of 0.1, an emission lifetime at the low temperature is at most ten times as long as an emission lifetime at room temperature. In the case of the delayed fluorescence, an emission lifetime strongly depends on temperatures because light emission occurs from different excited states at the low temperature and room temperature. Light emission occurs from a singlet at room temperature while light emission occurs from a triplet at the low temperature. Accordingly, the emission lifetime of the delayed fluorescence at the low temperature is ten or more times as long as the emission lifetime of the material at room temperature; depending on the kind of the compound, it may be observed that the former is two or more orders of magnitude longer than the latter. The emission lifetime of the light-emitting material used in the present invention shows the following characteristic when the material is in a solid state or solution state: an emission lifetime at the low temperature is 10 or more times, more specifically 50 or more times, or still more specifically 100 or more times as long as an emission lifetime at room temperature.

Further, in the case of phosphorescence, a non-radiation deactivation rate increases with increasing temperature, so emission intensity reduces with increasing temperature. In contrast, in the case of the delayed fluorescence, emission intensity increases with increasing temperature. This is because of the following reason: the probability that intersystem crossing from a triplet to a singlet by a Boltzmann distribution occurs is increased by external temperature energy, so a triplet exciton undergoes intersystem crossing to a singlet so as to be capable of easily emitting light. The foregoing is a method of determining whether light emission is phosphorescence or the delayed fluorescence.

Next, the constitution of the white organic EL device is described. The constitution of the white organic EL device is as follows: sub-emission layers for three colors, i.e., blue (B), green (G), and red (R) colors are laminated, and lights are simultaneously emitted from the layers and caused to undergo color mixture so that a white color may be obtained.

Examples of the combination of three color pixels, i.e., R, G, and B pixels each containing at least one delayed fluorescent material include, when DF, P, and F represent emission mechanisms for delayed fluorescence, phosphorescence, and fluorescence, respectively, (DF, P, P), (DF, DF, P), (DF, P, DF), (DF, DF, DF), (DF, F, F), (DF, DF, F), (DF, F, DF), (DF, P, F), (DF, F, P), (P, DF, P), (P, DF, DF), (F, DF, F), (F, DF, DF), (P, DF, F), (F, DF, P), (P, P, DF), (P, F, DF), (F, P, DF), and (F, F, DF).

As described above, light emission in which an organic EL device can achieve an internal quantum efficiency of 100% is the delayed fluorescence or phosphorescence. Therefore, a combination of the delayed fluorescence and phosphorescence or of the delayed fluorescence and the delayed fluorescence out of the above combinations is more preferable for obtaining a high-efficiency, white organic EL device.

Here, a white organic EL device illustrated in FIG. 1 formed by laminating sub-emission layers for three colors is described. Reference numeral 103 represents an anode; 104, a hole transport layer; 105, a green sub-emission layer; 106, a red sub-emission layer; 107, a blue sub-emission layer; 108, an electron transport layer; and 109, a cathode.

Figure 6:
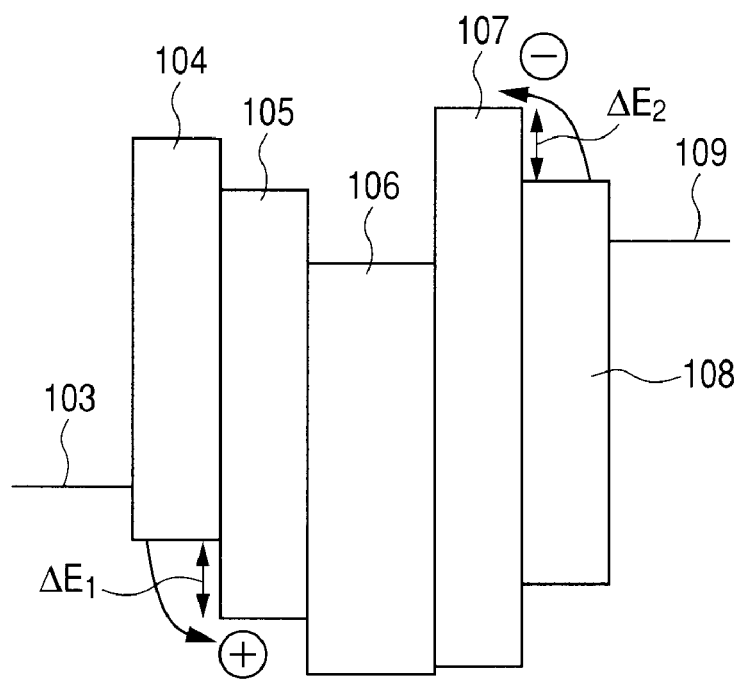
FIG. 6 is a schematic view of an energy level where attention is paid to a sub-emission layer portion of a white organic EL device.

FIG. 6 is a schematic view illustrating the energy level of the white organic EL device. Each of the R, G, and B layers may be formed of a mixture of a host material and a light emitting dopant, or may be formed only of the light emitting dopant. The host material is a material having a large weight ratio in each sub-emission layer, and the light emitting dopant is a guest material having a small weight ratio in the layer.

In each diagram illustrated in the figure, a band gap between the HOMO at the lower end and the LUMO at the upper end corresponds to the host material or the light emitting dopant.

Here, for the simplification of description, the HOMO and LUMO of each sub-emission layer correspond to the HOMO and LUMO of the host material. In other words, although the HOMO and LUMO of the light emitting dopant for each of the R, G, and B sub-emission layers are not illustrated, in each sub-emission layer, the HOMO of the dopant is shallower than the HOMO of the host material, and the LUMO of the dopant is deeper than the LUMO of the host material.

As described above, the use of a delayed fluorescent material can reduce the band gap. In FIG. 6, a hole injection barrier between the hole transport layer and the green sub-emission layer is represented by $\Delta E_1$, and an electron injection barrier between the electron transport layer and the blue sub-emission layer is represented by $\Delta E_2$. When a delayed fluorescent material is used, the $\Delta E_1$ and $\Delta E_2$ can be reduced in size because the band gaps of the green and blue sub-emission layers can be reduced.

As a result, the driving voltage of the white organic EL device can be reduced, and the power efficiency of the device can be improved. It should be noted that, when the delayed fluorescence and phosphorescence in one host material are considered, a hole or electron can be easily injected for the delayed fluorescence having a small band gap as compared to phosphorescence, so the driving voltage of the white organic EL device is can be similarly reduced.

Further, in the case of FIG. 6, the possibility that an electron is blocked increases in the green sub-emission layer. Accordingly, the possibility that a hole and an electron recombine in the entire emission layer increases. As a result, the efficiency of the white organic EL device can be improved.

Figure 7:
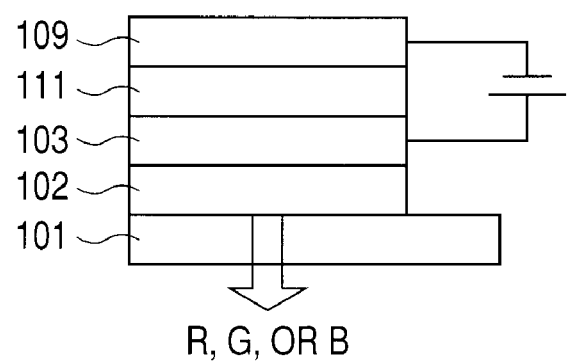
FIG. 7 illustrates an organic EL device including a white organic EL device and a color filter.

In the case of an organic EL full-color display apparatus, an organic EL device that emits light of any one of the three colors, i.e., the R, G, and B colors can be provided by mounting the white organic EL device with a color filter. When multiple organic EL devices of such kind are prepared, display in full color can be achieved. Meanwhile, the color filter itself absorbs light emitted from the white organic EL device, so total emission efficiency after passage through the color filter reduces. Therefore, a white organic EL device having additionally high efficiency and an additionally high luminance is absolutely necessary when the color filter is used. One approach to this end is to provide a white organic EL device which: has a low driving voltage; and consumes low power. FIG. 7 schematically illustrates an organic EL device having a color filter. A white light emitting device 111 is formed of R, G, and B sub-emission layers.

Reference numeral 102 represents the color filter; 103, an anode; 109, a cathode; and 101, a transparent glass substrate.

In view of the foregoing, the following procedure is effective: the delayed fluorescent material is used as a light emitting material for the white organic EL device.

As illustrated in FIG. 1, a white organic EL device is formed by laminating, on a substrate, an anode, a hole transport layer, an emission layer formed of multiple sub-emission layers, an electron transport layer, and a cathode. Although transparent glass is generally used here as the substrate, the substrate is not particularly limited as long as the substrate is transparent to such an extent that light can be extracted to the outside of the device.

A hole injection layer or electron injection layer may be further provided for reducing the voltage at which the device is driven, and a carrier blocking layer or exciton blocking layer may be provided so as to be adjacent to the emission layer for improving the efficiency of the device. In this embodiment, the following device constitution is described: the anode, the hole transport layer, the emission layer, the electron transport layer, and the cathode are laminated on a transparent glass substrate.

Indium tin oxide (ITO) as a transparent conductor is generally used in the anode. ITO has been consistently used in the anode in this embodiment as well; alternatively, an indium oxide/zinc oxide-based amorphous material (indium zinc oxide: IZO) or the like may be used. The thickness of the anode is not particularly limited. A method of forming the anode is, for example, a sputtering method, a vacuum evaporation method, or an ion plating method. Any one of the known film formation methods such as a vacuum evaporation method, an ink jet method, and a spin coating method may be adopted as a method of forming the organic layers (the hole transport layer, the emission layer, and the electron transport layer) on ITO.

In addition, the hole transport layer is not particularly limited as long as the layer has one of a function of injecting a hole from the anode and a function of transporting a hole. A material for the layer is specifically, for example, a conductive polymer such as an arylamine derivative, a carbazole derivative, or poly(3,4-ethylenedioxythiophene) (PEDOT-PSS).

In this embodiment, the order in which the sub-emission layers of the emission layer are laminated is not particularly limited. In addition, the respective sub-emission layers are not necessarily needed to be in contact with each other, and, for example, the following constitution may be adopted: a layer free of any light emitting dopant is interposed between two adjacent sub-emission layers.

Further, one sub-emission layer may contain multiple kinds of light emitting materials different from each other in emission wavelength. The term "multiple kinds" as used herein refers to any one of a delayed fluorescent material, a phosphorescent material, and a fluorescent material.

A host material for the emission layer is not particularly limited as long as the host material efficiently supplies the energy of an exciton to a guest material for each color.

As in the case of the hole transport layer, the electron transport layer is not particularly limited as long as the layer has one of a function of injecting an electron from the cathode and a function of transporting an electron. For example, a metal complex such as bathophenanthroline (Bphen), 4-biphenyloxolatoaluminum (III) bis(2-methyl-8-quinolinato)-4-phenylphenolate (BAlq$_3$), or a quinolinol derivative can be used.

The cathode is formed on the electron transport layer. A metal, alloy, or the like having a small work function is used in the cathode. Alternatively, magnesium, lithium, a magnesium/aluminum alloy, or the like may be used.

A lighting unit can be provided by using the organic EL device according to the present invention.

It should be noted that the emission of white light in the present invention is as follows: the light has chromaticity coordinates (X, Y) in a CIE1931 colorimetric system of preferably (0.33±0.15, 0.33±0.15), or more preferably (0.33±0.07, 0.33±0.07).

In addition, the direction in which light is extracted may be of a bottom emission type in which light is extracted from the side same as a substrate, or may be of a top emission type in which light is extracted from the side opposite to a substrate. In the case of the top emission type, the cathode is desirably a transparent electrode using a transparent material, and the anode is desirably of such a constitution that a reflective electrode using a reflective metal and a transparent electrode are laminated. With such constitution, light extraction efficiency can be improved by utilizing optical interference.

Alternatively, the white organic EL device according to the present invention may be used as a pixel in a display apparatus. The following constitution may be adopted: each of multiple pixels is connected to a switching device such as a TFT so that the luminance of the device may be controlled by the switching device.

EXAMPLE 1

A specific constitution of a white organic EL device is shown.

ITO/α-NPD (40 nm)/CBP+10 mass % [Cu(tsmp)]$_2$ (60 nm)/CBP+10 mass % Ir(piq)$_3$ (80 nm)/CDBP+10 mass % FIrpic (30 nm)/BCP (40 nm)/LiF (0.5 nm)/Al (100 nm)

First, an ITO film (120 nm) was formed on a transparent glass substrate serving as a support member and having a thickness of 1.1 mm by a sputtering method, and the resultant was used as an anode side transparent electrode. The electrode was subjected to ultrasonic cleaning with 2-propanol (IPA) and boil washing, and was then dried. After that, the electrode was subjected to UV/O$_3$ cleaning, and α-NPD (Compound 3) was deposited from the vapor in a vacuum onto the electrode to serve as a hole transport layer. Film formation was performed under the following conditions: the pressure in the chamber of a vacuum evaporator was reduced so that a degree of vacuum in the chamber might be $5\times10^{-5}$ Pa, and then an evaporation rate was stabilized. The thickness of the hole transport layer formed of α-NPD was set to 40 nm.

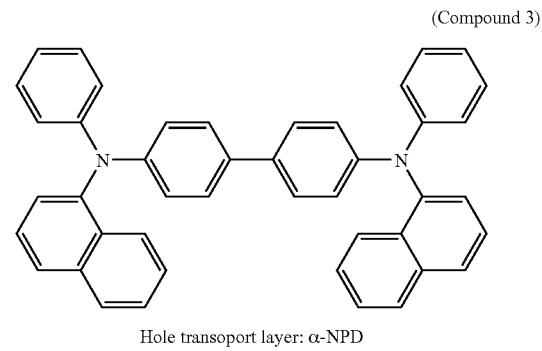

(Compound 3)

Hole transoport layer: α-NPD

Sub-emission layers for three colors, i.e., green, red, and blue sub-emission layers were formed by laminating on the hole transport layer in the stated order by a vacuum evaporation method. In Example 1, a delayed fluorescent material [Cu(tsmp)]$_2$ (Compound 1) was used as a dopant for the green sub-emission layer, a phosphorescent material Ir(piq)$_3$ (Compound 4) was used as a dopant for the red sub-emission layer, and a phosphorescent material FIrpic (Compound 5) was used as a dopant for the blue sub-emission layer. In addition, CBP (Compound 6) was used as a host material for each of the green and red sub-emission layers, and CDBP (Compound 7) was used as a host material for the blue sub-emission layer.

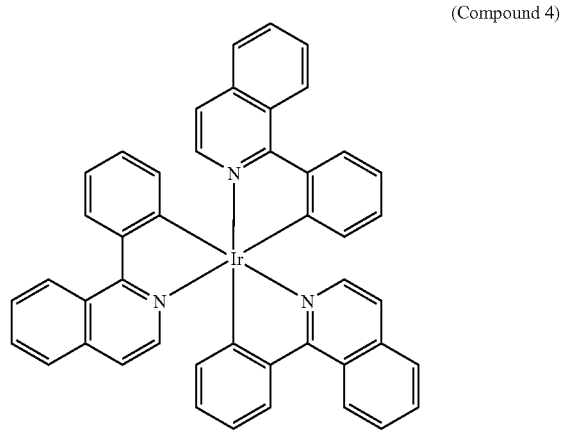

(Compound 4)

Red dopant: phosphorescent material Ir(piq)$_3$ 10 mass %

-continued (Compound 5)

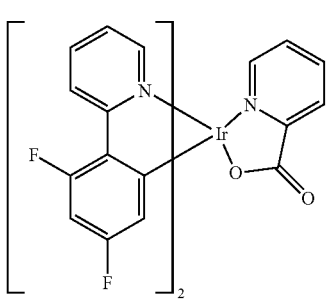

Blue dopant: phosphorescent material FIrpic 10 mass %

(Compound 6)

Green and red hosts: CBP (Compound 7)

Blue host: CDBP

Evaporation rates for each sub-emission layer were as follows: the host material and the dopant material were co-evaporated at rates of 0.9 Å/sec and 0.1 Å/sec, respectively (at a doping ratio of 10 mass %). The green sub-emission layer had a thickness of 60 nm, the red sub-emission layer had a thickness of 80 nm, and the blue sub-emission layer had a thickness of 30 nm.

BCP (Compound 8) was formed into a film on the blue sub-emission layer to serve as an electron transport layer by vacuum evaporation. The layer had a thickness of 40 nm.

(Compound 8)

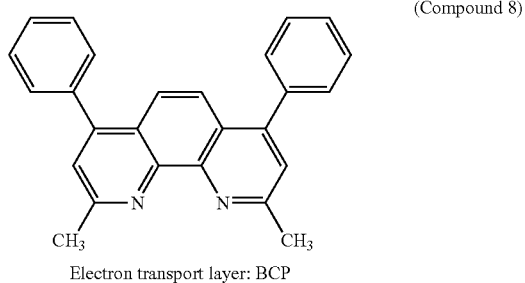

Electron transport layer: BCP

Aluminum (Al) having a 0.5 nm layer of lithium fluoride (LiF) provided on its surface was formed on the electron transport layer to serve as a cathode by a vacuum evaporation method. The cathode had a thickness of 100 nm.

Figure 2:
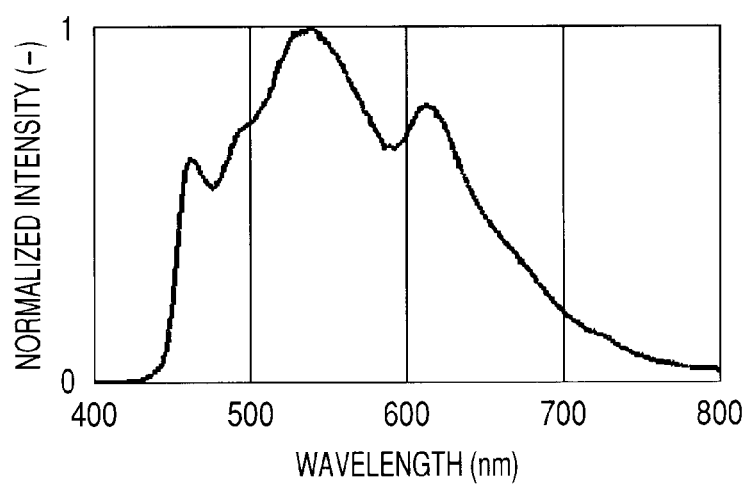
FIG. 2 illustrates an EL spectrum of the white organic EL device produced in Example 1.

The EL spectrum of the white organic EL device thus produced was measured and evaluated. FIG. 2 illustrates the EL spectrum of the white organic EL device produced in Example 1. The following facts were observed: the device emitted good white light having chromaticity coordinates (X, Y) in a CIE1931 colorimetric system of (0.34, 0.32) at a front luminance of 1,000 cd/m$^2$; further, the device stably emitted light while maintaining a color purity even after having been energized for 2 hours.

EXAMPLE 2

This example relates to a white organic EL device in which light is extracted from the side opposite to a transparent glass substrate.

First, a TFT driver circuit formed of low-temperature polysilicon was formed on the transparent glass substrate serving as a support member, and a planarization film formed of an acrylic resin was formed on the circuit. A silver alloy (Ag-CuNd) was patterned into a film having a thickness of 100 nm on the film to serve as a reflective electrode by a sputtering method. Further, IZO was patterned into a film having a thickness of 30 nm on the reflective electrode to serve as a transparent electrode by a sputtering method. Thus, an anode as a lower electrode was formed. Further, a device isolation film was formed of an acrylic resin. Thus, an anode side transparent electrode substrate was produced. The substrate was subjected to ultrasonic cleaning with IPA and boil washing, and was then dried. After that, the substrate was subjected to UV/O3 cleaning, and a hole transport layer, G, R, and B sub-emission layers, and an electron transport layer were sequentially laminated in the same manner as in Example 1.

A co-evaporated film of BCP and $Cs_2CO_3$ (at a weight ratio of 9:1) having a thickness of 14 nm was formed on the electron transport layer to serve as an electron injection layer at a degree of vacuum of $2.0 \times 10^{-4}$ Pa. Finally, silver (Ag) was formed into a film having a thickness of 15 nm to serve as a cathode by a vacuum evaporation method at a degree of vacuum of $2.0 \times 10^{-4}$ Pa. Thus, the white organic EL device was produced.

Figure 3:
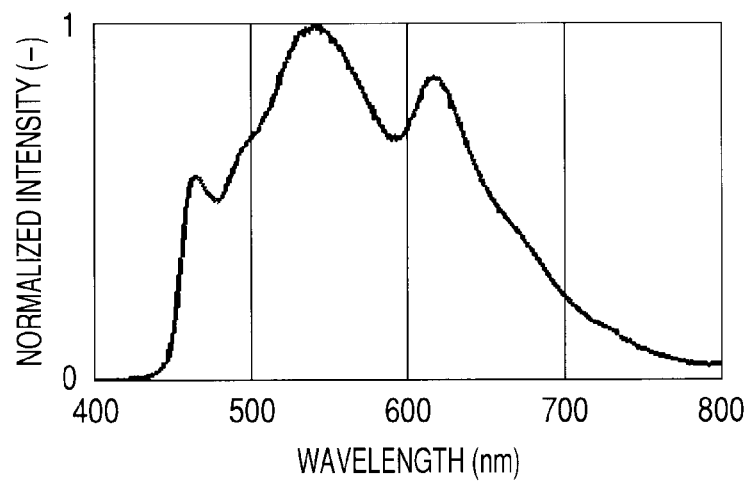
FIG. 3 illustrates the EL spectrum of a white organic EL device produced in Example 2.

The EL spectrum of the white organic EL device thus produced was measured and evaluated. FIG. 3 illustrates the EL spectrum of the white organic EL device. The following facts were observed: the device emitted good white light having chromaticity coordinates (X, Y) in a CIE1931 colorimetric system of (0.34, 0.34) at a front luminance of 1,000 cd/m$^2$; further, the device stably emitted light while maintaining a color purity even after having been energized for 2 hours.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-264426, filed Oct. 10, 2008, and Japanese Patent Application No. 2009-222632, filed Sep. 28, 2009, which are hereby incorporated by reference herein in their entirety.

What is claimed is:
1. A white organic electroluminescent device for emitting white light, the device comprising:
a substrate;
an anode placed;
a hole transport layer;

an emission layer having a red sub-emission layer, a green sub-emission layer, and a blue sub-emission layer; and
a cathode,
the anode, the hole transport layer, the emission layer and the cathode being placed on the substrate,
wherein:
the green sub-emission layer is placed to be in contact with the hole transport layer;
the red sub-emission layer is placed to be in contact with the green sub-emission layer;
the blue sub-emission layer is placed to be in contact with the red sub-emission layer;
the green sub-emission layer comprises a delayed fluorescent material;
the red sub-emission layer comprises a phosphorescent light emitting material;
a highest occupied molecular orbital (HOMO) of the delayed fluorescent material is deeper than an HOMO of a material of the hole transport layer; and
the HOMO of the delayed fluorescent material is shallower than an HOMO of the phosphorescent light emitting material.

2. The white organic electroluminescent device according to claim 1, wherein:
an HOMO of a host material for the green sub-emission layer is deeper than the HOMO of the material of the hole transport layer; and
the HOMO of the host material for the green sub-emission layer is shallower than an HOMO of a host material for the red sub-emission layer.

3. The white organic electroluminescent device according to claim 2, wherein the cathode comprises a transparent electrode placed on a light extraction side.

4. A display apparatus, comprising:
a display unit including the white organic electroluminescent device according to claim 1; and
a TFT for controlling a luminance of the white organic electroluminescent device.

* * * * *